(12) United States Patent
Plagens et al.

(10) Patent No.: US 6,492,697 B1
(45) Date of Patent: Dec. 10, 2002

(54) HALL-EFFECT ELEMENT WITH INTEGRATED OFFSET CONTROL AND METHOD FOR OPERATING HALL-EFFECT ELEMENT TO REDUCE NULL OFFSET

(75) Inventors: Mark R. Plagens, Richardson, TX (US); Michael J. Haji-Sheikh, Richardson, TX (US); Walter T. Matzen, Richardson, TX (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/542,213

(22) Filed: Apr. 4, 2000

(51) Int. Cl.[7] ............................................. H01L 29/82
(52) U.S. Cl. ...................... 257/426; 257/421; 257/427; 338/32; 324/251
(58) Field of Search ............................. 257/3, 4, 421, 257/426, 427; 338/32; 324/251

(56) References Cited

U.S. PATENT DOCUMENTS

| | | | |
|---|---|---|---|
| 3,825,777 A | * 7/1974 | Braun | ........................ 327/511 |
| 4,660,065 A | * 4/1987 | Carvajal et al. | ............ 257/426 |
| 4,929,993 A | 5/1990 | Popovic | |
| 4,996,432 A | * 2/1991 | Saitou | ................... 250/370.01 |

FOREIGN PATENT DOCUMENTS

| | | | |
|---|---|---|---|
| EP | 0 735 600 | 10/1996 | |
| JP | 01162386 A | * 6/1989 | ................. 257/421 |
| JP | 10 270773 | 10/1998 | |
| JP | 11 087798 | 3/1999 | |

OTHER PUBLICATIONS

Patent Cooperation Treaty, International Search Report, Jul.17, 2002, on European counterpoint of current patent application.

* cited by examiner

Primary Examiner—Nathan J. Flynn
Assistant Examiner—Scott R Wilson
(74) Attorney, Agent, or Firm—Kris T. Fredrick

(57) ABSTRACT

A Hall-effect element includes an isolating layer and an active layer of a first electrical conductivity type disposed on the isolating layer, the active layer having a surface. A first set of contacts is disposed in contact with the surface along a first axis, and a second set of contacts is disposed in contact with the surface along a second axis transverse to the first axis. An insulating layer is disposed on the surface. A metal control field plate is disposed on the insulating layer and is coupleable to a voltage source to control the accumulation of charge carriers at the surface of the active layer to vary the resistance of the active layer. Also, a method is provided for reducing null offset in a Hall-effect element. The method includes the steps of providing an isolating layer, disposing an active layer of a first electrical conductivity type on the isolating layer, the active layer having a surface, disposing a first set of contacts on the surface along a first axis, disposing a second set of contacts on the surface along a second axis transverse to the first axis; and disposing an insulating layer on the surface. A voltage is applied across the insulating layer to control the accumulation of charge carriers at the surface to vary the resistance of the active layer.

20 Claims, 3 Drawing Sheets

HALL-EFFECT ELEMENT WITH INTEGRATED OFFSET CONTROL AND METHOD FOR OPERATING HALL-EFFECT ELEMENT TO REDUCE NULL OFFSET

BACKGROUND OF THE INVENTION

The present invention is directed generally to a Hall-effect element with offset control and a method for operating a Hall-effect element to reduce null offset, and, in particular, a Hall-effect element with integrated offset control and a method for operating a Hall-effect element having integrated offset control to reduce null offset.

Hall-effect elements are well known in the art. Hall-effect elements rely on a reaction between a current flowing between a first set of contacts and an orthogonally-applied magnetic field to generate a voltage across a second set of contacts.

In theory, with no magnetic field applied to the Hall-effect element, no voltage should be generated across the second set of contacts. In practice, a voltage is typically generated across the second set of contacts even with no magnetic field applied to the Hall-effect element. This voltage is referred to as null offset.

There are several reasons for the deviation between theory and practice. For example, process variations in the fabrication of the Hall-effect element may cause local variations in resistance. Stress across the element in either wafer or packaged form may also cause local variations in resistance because of piezoresistive effects. Further, unbalance in the subsequent amplifiers typically used with Hall-effect elements also can contribute to null offset.

While the null offset is usually quite small, it still can be large enough to affect the proper operation of the Hall-effect element. As a consequence, a trimmer network is typically provided to balance the resistance variations. For example, the trimmer network may include a current mirror with trimmable degeneration resistors.

Trimmer networks come with their own set of associated problems. For example, Hall-effect elements are generally fabricated using a lightly doped n-type layer for heightened sensitivity to variations in magnetic field intensity. This means, however, that the element is also particularly sensitive to variations in temperature. As a consequence, the trimmer network must be able to adapt to the variations in resistance accompanying the variations in temperature. Furthermore, the subsequent amplifiers may also have variations with temperature which require compensation.

One way to make the trimmer network responsive to variations in resistance accompanying the variations in temperature is to provide a large reference resistor in close thermal proximity to the device that requires temperature compensation. For example, the reference resistor may be disposed in close proximity to the Hall-effect element, and coupled to the associated trimmer network. In operation, the trimmer network directs a portion of the current flowing through the reference resistor through the one of the Hall-effect element contacts to compensate for temperature-dependent changes in resistance. If variations occur in subsequent amplifiers or comparators, reference resistors must be provided for these devices as well.

Another way to achieve temperature compensation involves using switches on the same chip as the Hall-effect element to direct current alternatively to the separate sets of Hall-effect element contacts. The output voltage difference between the two contacts is stored on a capacitor to allow subsequent compensations of the Hall-effect element.

Disadvantageously, these trimmer networks with their associated compensation devices increase the size and complexity of the Hall-effect elements, both in terms of fabrication and operation.

SUMMARY OF THE INVENTION

The following summary of the invention is provided to facilitate an understanding of some of the innovative features unique to the present invention, and is not intended to be a full description. A full appreciation of the various aspects of the invention can be gained by taking the entire specification, claims, drawings, and abstract as a whole.

According to an aspect of the present invention, a Hall-effect element includes an isolating layer and an active layer of a first electrical conductivity type disposed on the isolating layer, the active layer having a surface. A first set of contacts is disposed in contact with the surface along a first axis, and a second set of contacts is disposed in contact with the surface along a second axis transverse to the first axis. An insulating layer is disposed on the surface, and a metal control field plate is disposed on the insulating layer. A voltage source is selectively coupleable to the metal control field plate to control the accumulation of charge carriers at the surface of the active layer to vary the resistance of the active layer.

According to another aspect of the present invention, a Hall-effect apparatus includes a Hall-effect structure, a first set of contacts disposed on the structure along a first axis, and a second set of contacts disposed on the structure along a second axis transverse to the first axis. A metal control field plate is disposed in relation to the structure such that, when a voltage is selectively coupled to the metal control field plate, the Hall-effect apparatus has a zero output in the absence of a magnetic field.

According to a further aspect of the present invention, a method is provided for reducing null offset in a Hall-effect element. The method includes the steps of providing an isolating layer, disposing an active layer of a first electrical conductivity type on the isolating layer, the active layer having a surface, disposing a first set of contacts on the surface along a first axis, disposing a second set of contacts on the surface along a second axis transverse to the first axis, and disposing an insulating layer on the active layer. A voltage is applied across the insulating layer to control the accumulation of charge carriers at the surface to vary the resistance of the active layer.

The novel features of the present invention will become apparent to those of skill in the art upon examination of the following detailed description of the invention or can be learned by practice of the present invention. It should be understood, however, that the detailed description of the invention and the specific examples presented, while indicating certain embodiments of the present invention, are provided for illustration purposes only because various changes and modifications within the scope of the invention will become apparent to those of skill in the art from the detailed description of the invention and claims that follow.

BRIEF DESCRIPTION OF THE DRAWINGS

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

DETAILED DESCRIPTION OF THE INVENTION

Figure 1:
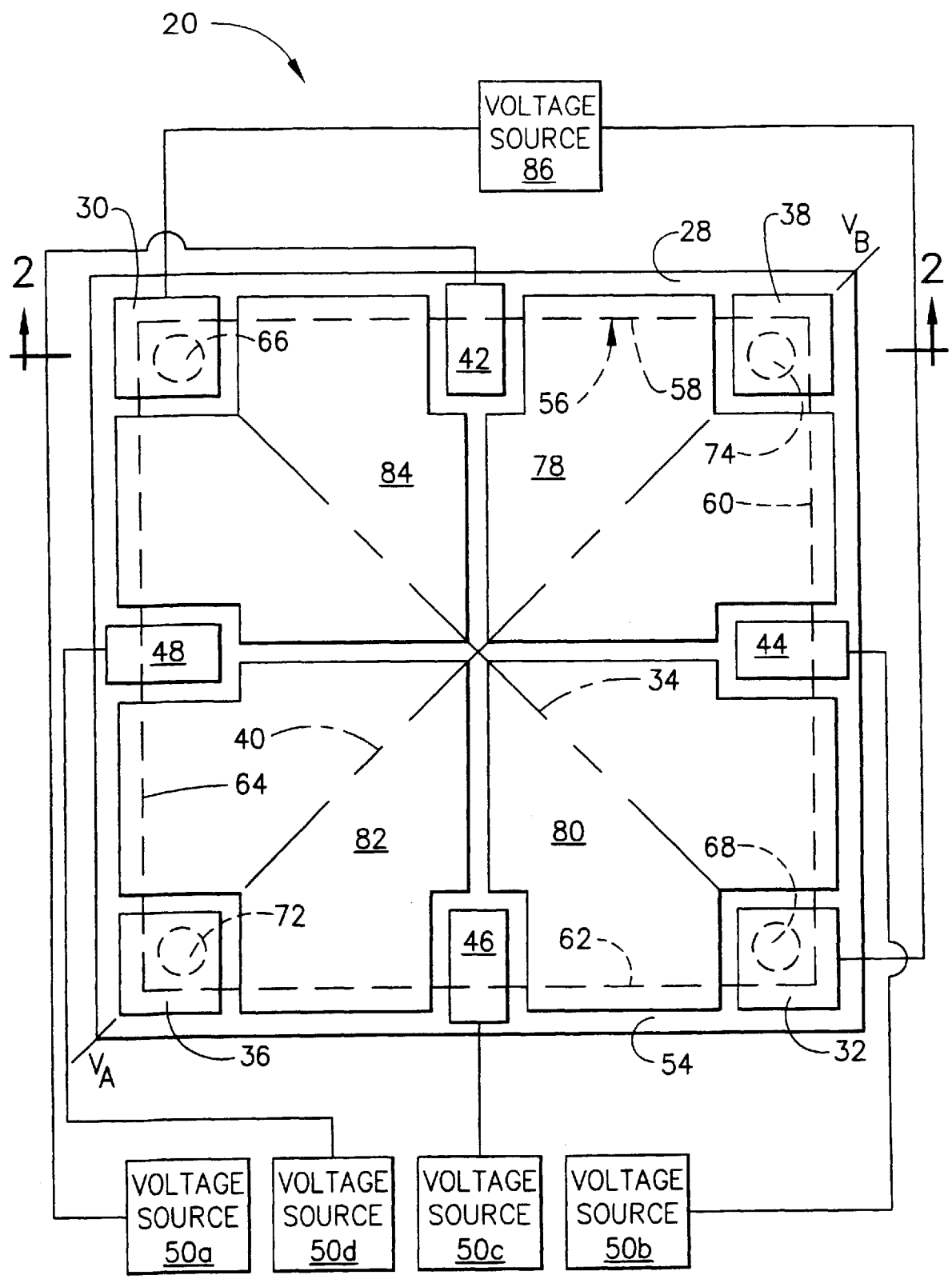
FIG. 1 is a schematic view of a Hall-effect element according to the present invention.
Figure 2:
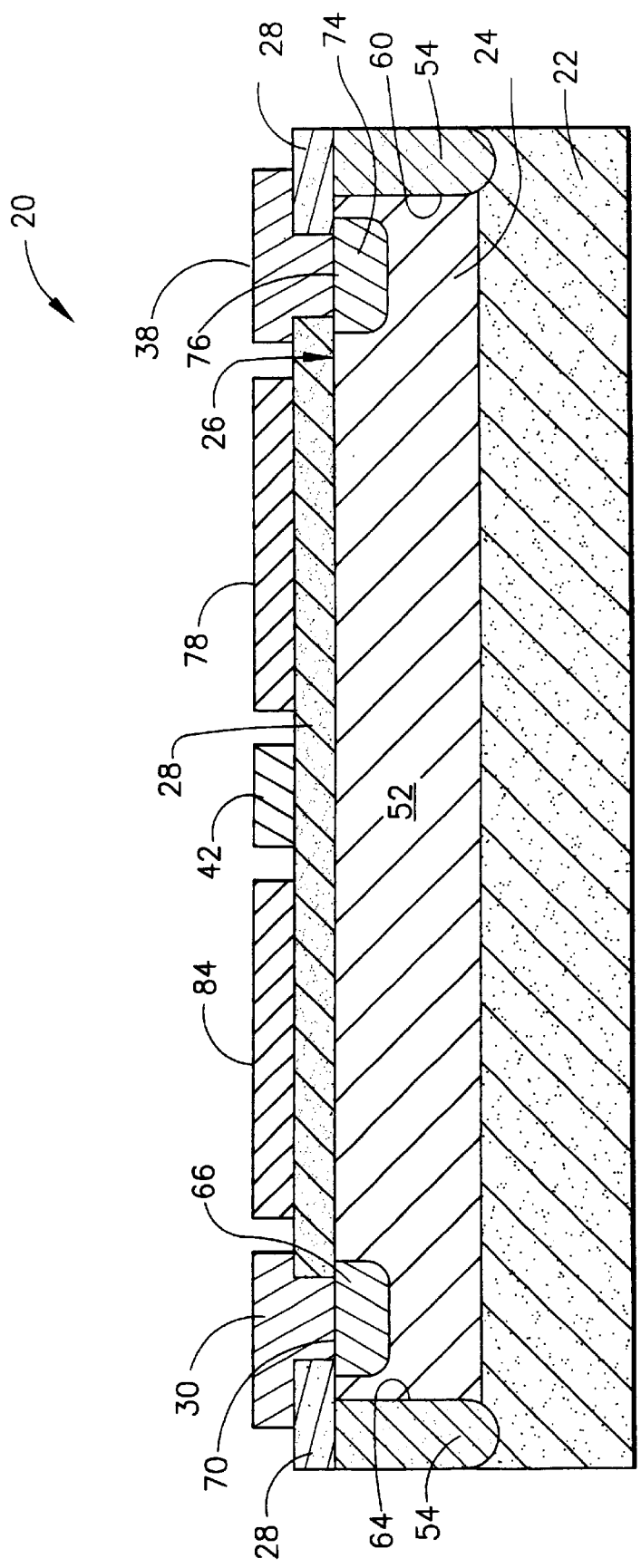
FIG. 2 is a cross-sectional view taken along line 2—2 in FIG. 1.

An embodiment of a Hall-effect element 20 according to the present invention is shown in FIGS. 1 and 2. As shown in FIG. 2, the element 20 includes an isolating layer 22 and an active layer 24 of a first conductivity type disposed on the isolating layer 22. The layer 24 has a surface 26. An insulating layer 28 is disposed on the layer 24 over a substantial portion of the surface 26.

As shown in FIG. 1, a first set of contacts 30, 32 is disposed in contact with the surface 26 of the layer 24 along a first axis 34, and a second set of contacts 36, 38 is disposed in contact with the surface 26 of the layer 24 along a second axis 40 transverse to the first axis 34. Disposed on the layer 28 are four metal control field plates 42, 44, 46, 48 which are each preferably selectively and individually coupleable to a voltage source 50a, 50b, 50c, 50d. The voltage sources 50a, 50b, 50c, 50d can have predetermined, fixed voltages; alternatively, the voltage sources 50a, 50b, 50c, 50d can have variable voltages, initially set to a predetermined voltage and varying therefrom in accordance with changes in operating conditions.

In operation, voltage is applied to the control field plates 42, 44, 46, 48 to vary the accumulation of charge carriers at the surface 26 of the layer 24 (i.e., attract or repel the charge carriers). By changing the accumulation of charge carriers at the surface 26, the resistance of the layer 24 can be varied. That is, if more charge carriers are available in a given region, then the resistance of the layer 24 in that region will decrease; conversely, if fewer charge carriers are available, then the resistance of the layer 24 will increase. By controlling the resistance of the layer 24, a substantially null at zero applied magnetic field can be achieved.

Multiple control field plates 42, 44, 46, 48 are used in the embodiment of the element 20 according to the present invention to allow for greater selectivity in the control of the resistance of the layer 24. The number of control field plates can vary according to the degree to which control of local resistance is desired.

The method and apparatus by which voltage compensation is provided in element 20 has several advantages. The charge carriers accumulated at the surface 26 of the layer 24 as a result of voltage applied to the control plates 42, 44, 46, 48 should have similar mobility as the charge carriers in other regions of the layer 24, thereby providing inherent temperature compensation. Further, the size and complexity of the compensation circuitry is reduced over that conventionally used.

The Hall-effect element 20 is now described in greater detail. The isolating layer 22 is preferably a p-type silicon, and the active layer 24 is preferably an n-type epitaxial silicon layer that is grown on the isolating layer 22. Alternatively, the layer 22 can be silicon dioxide ($SiO_2$), and the layer 24 may be a p-type silicon or any semiconductor material, such as gallium arsenide. The active layer 24 has an active region 52 preferably bounded by diffusion of p-type charge carriers into a boundary region 54 at an outer edge 56 of the active region 52. Alternatively, the boundary region 54 can be silicon dioxide ($SiO_2$). The active region 52 has a square-shape with sides 58, 60, 62, 64, although other geometries (e.g., rectangular or truncated square or rectangular) are possible. The insulating layer 28 (for example, a p-type silicon or an insulator, such as silicon dioxide ($SiO_2$)) is grown over the active layer 24.

The first set of contacts 30, 32 is deposited over the insulating layer 28 along the first axis 34 in contact with heavily doped regions 66, 68 of the layer 24 having the same type as the layer 24, thus defining a low-resistance contact. FIG. 2 shows one of the ohmic contact regions 70 between the contact 30 and the doped region 66. The second set of contacts 36, 38 are deposited over the insulating layer 28 along the second axis 40 in contact with doped regions 72, 74, defining ohmic contact regions, one of which is shown as 76. With the contacts of the first set of contacts 30, 32 and the second set of contacts 36, 38 disposed at opposite corners of the square-shaped active region 52, the first and second axes 34, 40 define the diagonals of the square-shaped active region 52, and are thus substantially orthogonal to each other.

Four spaced metal (for example, aluminum) plates 78, 80, 82, 84 are also deposited over the insulating layer 28. The metal plates 78, 80, 82, 84 substantially cover the active region 52 to shield the surface 26 from the effects of surface charge or electric fields. In the geometry shown in FIG. 1, each of the shield plates 78, 80, 82, 84 covers a separate quadrant of the square-shaped active region 52, and each is preferably connected to a separate terminal, which can be coupled, for example to ground or $V_{cc}$. Alternatively, other arrangements and connections are possible; for example a single-shield plate can be used, or all of the plates can be connected to a single terminal.

Further, the control field plates 42, 44, 46, 48 are deposited on the insulating layer 28, each plate along a different side 58, 60, 62, 64 of the square-shaped active region 52. The control field plates 42, 44, 46, 48 are spaced from each other and from the shield plates 78, 80, 82, 84. The control field plates 42, 44, 46, 48 form MOS capacitor structures, and voltage applied to the control field plates 42, 44, 46, 48 controls the accumulation of charge carriers on the surface 26 under the insulating layer 28. For typical silicon device processing, positive surface state charges are formed at the oxide-layer interface 26 (FIG. 2). Positive voltages applied to the control field plates 42, 44, 46, 48 increase the accumulation of n-type charge carriers at the surface 26 and thereby decrease a local resistance in a corresponding region of the layer 24 proximate to the control field plates 42, 44, 46, 48; negative voltages decrease the accumulation charge carriers and thereby increase resistance.

In operation, the first set of contacts 30, 32 is coupled to a voltage source 86, as shown. When a magnetic field is applied perpendicularly to the Hall-effect element 20, the flow of charge carriers is skewed in the plane of the layer 24 and is perpendicular to the flow of current between the first set of contacts 30, 32. The resultant field produces an output voltage between the second set of contacts 36, 38. The output voltage increases linearly with voltage applied across the first set of contacts 30, 32 and the strength of the magnetic field, and is positive or negative depending on the polarity of the magnetic field.

Without voltage applied to the control field plates 42, 44, 46, 48, the voltage between the second set of contacts 36, 38 can include an offset voltage component. The offset voltage, as discussed above, is caused by local resistance variations due to fabrication flaws and material stresses, for example. To balance the local resistances and limit the offset voltage, voltage is applied to one or more of the control field plates 42, 44, 46, 48 to vary the local resistances in the corresponding regions by varying the accumulation of charge carriers at the surface 26. In fact, the shape and size of the plates 42, 44, 46, 48 can be selected to assist in the control of the local resistances. In this manner, the offset voltage can be reduced to substantially zero.

Figure 3:
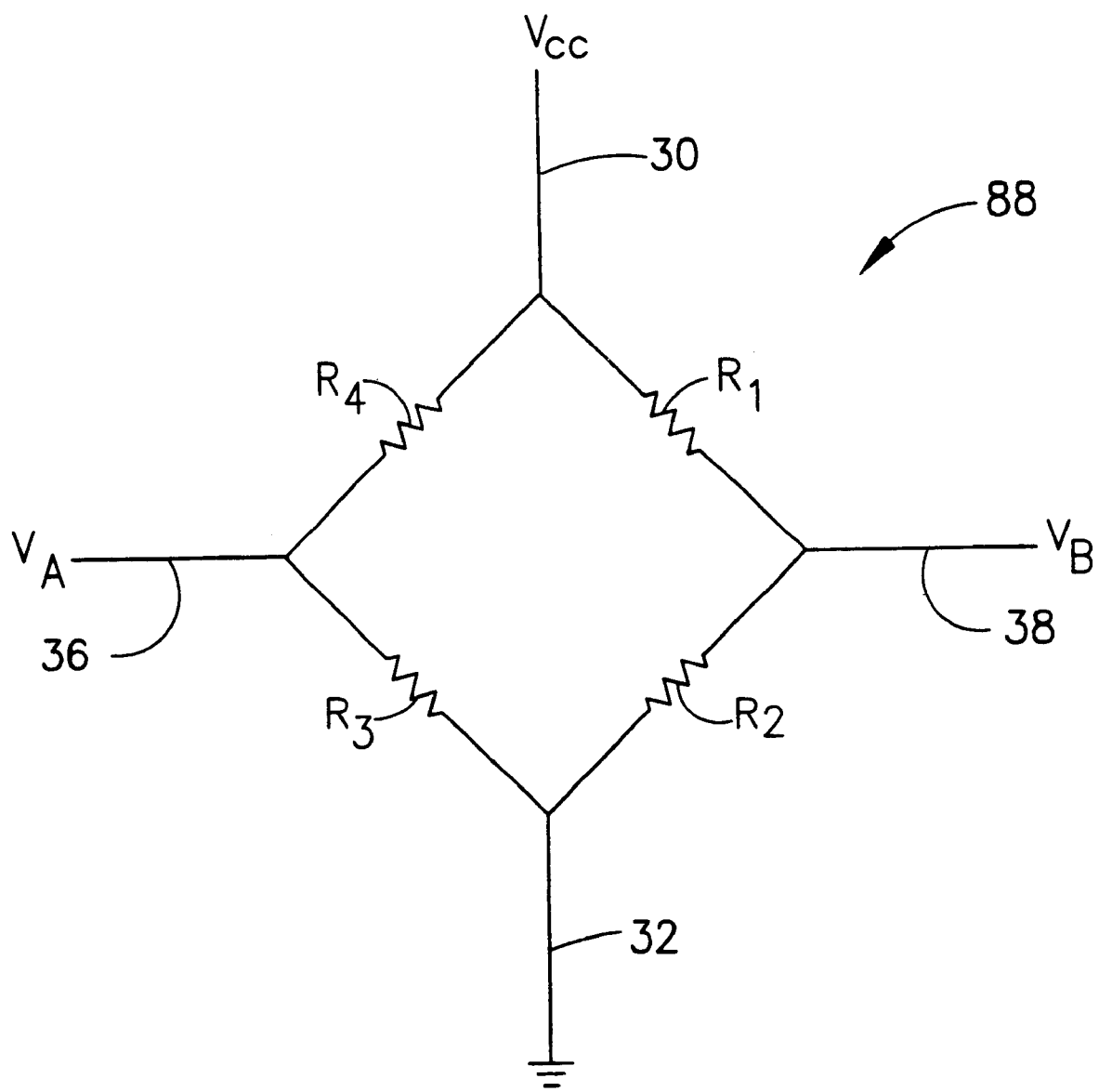
FIG. 3 is a schematic view of a Wheatstone bridge equivalent circuit for the Hall-effect element of FIG. 1.

To further illustrate the Hall-effect element 20 according to the present invention, an alternative representation for the Hall-effect element 20 is shown in FIG. 3. In particular, a Wheatstone bridge equivalent circuit 88 for the Hall-effect element 20 is shown. For an ideal Hall-effect element 20, in which the local resistances R1, R2, R3, R4 are completely uniform and dimensions are symmetrical, the output for zero magnetic field would be zero. In a non-ideal Hall-effect element 20, where R1, R2, R3, R4 are not initially uniform, the control field plates 42, 44, 46, 48 are used to vary the local resistances R1, R2, R3, R4 so that the output for zero magnetic field is substantially zero (i.e., the bridge is balanced).

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is not intended to be exhaustive nor to limit the scope of the invention. Many modifications and variations are possible in light of the above teaching without departing from the spirit and scope of the following claims. It is contemplated that the use of the present invention can involve components having different characteristics. It is intended that the scope of the present invention be defined by the claims appended hereto, giving full cognizance to equivalents in all respects.

The embodiments of an invention in which an exclusive property or right is claimed are defined as follows:

1. A Hall-effect element comprising:
   an isolating layer;
   an active layer of a first electrical conductivity type disposed on the isolating layer and having a surface;
   a first set of contacts disposed in contact with the surface along a first axis;
   a second set of contacts disposed in contact with the surface along a second axis transverse to the first axis;
   an insulating layer disposed on the surface; and,
   a metal control field plate disposed on the insulating layer so as to form a capacitor, wherein the metal control field plate is coupleable to a voltage source to control the accumulation of charge carriers at the surface of the active layer to vary the resistance of the active layer.

2. The Hall-effect element according to claim 1, further comprising four metal control field plates, each plate individually coupleable to a voltage source to control the accumulation of charge carriers at the surface of the active layer to vary a local resistance of the active layer proximate to each plate.

3. The Hall-effect element according to claim 2, further comprising a boundary region wherein charge carriers of a second electrical conductivity type are diffused into the active layer of the first electrical conductivity type, the boundary region defining a hypothetical square-shaped active region having four corners and four sides, the first and second sets of contacts disposed at opposite corners of the square-shaped active region along respective diagonals of the square-shaped active-region and the four metal plates disposed along the sides of the square-shaped active region.

4. The Hall-effect element according to claim 3, further comprising four metal shield plates disposed directly on the insulating layer, the metal shield plates spaced from each other and from the metal control field plates.

5. The Hall-effect element according to claim 4, wherein the isolating layer comprises a p-type material, and the active layer comprises an n-type material.

6. The Hall-effect element according to claim 4, wherein the first and second axes are orthogonal.

7. The Hall-effect element according to claim 4, wherein charge carriers diffused into the active layer of a first electrical conductivity type in the boundary region comprise p-type charge carriers.

8. The Hall-effect element according to claim 4, wherein the insulating layer comprises silicon dioxide.

9. The Hall-effect element according to claim 4, wherein the metal shield plates comprise aluminum plates.

10. A Hall-effect apparatus comprising:
    a Hall-effect structure;
    a first set of contacts disposed on the structure along a first axis;
    a second set of contacts disposed on the structure along a second axis transverse to the first axis; and,
    a metal control field plate disposed in relation to the structure so as to form a capacitor such that, when a voltage is selectively coupled to the metal control field plate, the Hall-effect apparatus has a zero output in the absence of a magnetic field.

11. The Hall-effect apparatus according to claim 10, wherein the Hall-effect structure comprises:
    an isolating layer;
    an active layer of a first electrical conductivity type disposed on the isolating layer and having a surface; and
    an insulating layer disposed on the surface.

12. The Hall-effect apparatus according to claim 11, wherein:
    the isolating layer comprises a p-type material;
    the active layer comprises an n-type material; and
    the voltage is a positive voltage that decreases the resistance of the active layer.

13. The Hall-effect apparatus according to claim 11, wherein:
    the isolating layer comprises a p-type material;
    the active layer comprises an n-type material; and
    the voltage is a negative voltage that increases the resistance of the active layer.

14. The Hall-effect apparatus according to claim 11, further comprising a plurality of metal control field plates, voltages individually and selectively coupleable to each of the control field plates to control the accumulation of charge carriers at the surface of the active layer to vary a local resistance of a region of the active layer proximate to the each plate.

15. The Hall-effect apparatus according to claim 11, further comprising:
    a boundary region wherein charge carriers of a second electrical conductivity type are diffused into the active layer of the first electrical conductivity type, the boundary layer defining a hypothetical square-shaped active region having four sides; and four metal control field plates, each plate disposed along a different one of the four sides of the square-shaped active region, voltages individually and selectively coupleable to each of the control field plates to control the accumulation of charge carriers at the surface of the active layer to vary a local resistance of a region of the active layer proximate to the each plate.

16. A Hall-effect element comprising:

an active semiconductor layer having a surface;

a set of supply contacts disposed in contact with the surface along a first axis;

a set of sense contacts disposed in contact with the surface along a second axis that intersects the first axis; and, a metal control field plate disposed in relation to the active semiconductor layer and coupleable to a voltage source to control the accumulation of charge carriers at the surface of the active layer to vary the resistance of the active layer.

17. The Hall-effect element of claim 16 wherein the metal control field plate lies along a line intersecting one of the supply contacts and one of the sense contacts.

18. The Hall-effect element of claim 17 wherein the metal control field plate forms a capacitor with the active semiconductor layer.

19. The Hall-effect element of claim 16 wherein the set of supply contacts comprises first and second supply contacts, wherein the set of sense contacts comprises first and second sense contacts, wherein the metal control field plate comprises a first metal control field plate that lies along a line intersecting the first supply contact and the first sense contact, wherein the Hall-effect element comprises second, third, and fourth metal control field plates, wherein the second metal control field plate lies along a line intersecting the first supply contact and the second sense contact, wherein the third metal control field plate lies along a line intersecting the second supply contact and the second sense contact, and wherein the fourth metal control field plate lies along a line intersecting the second supply contact and the first sense contact.

20. The Hall-effect element of claim 19 wherein the first metal control field plate forms a first capacitor with the active semiconductor layer, wherein the second metal control field plate forms a second capacitor with the active semiconductor layer, wherein the third metal control field plate forms a third capacitor with the active semiconductor layer, and wherein the fourth metal control field plate forms a fourth capacitor with the active semiconductor layer.

* * * * *